Figure 1:
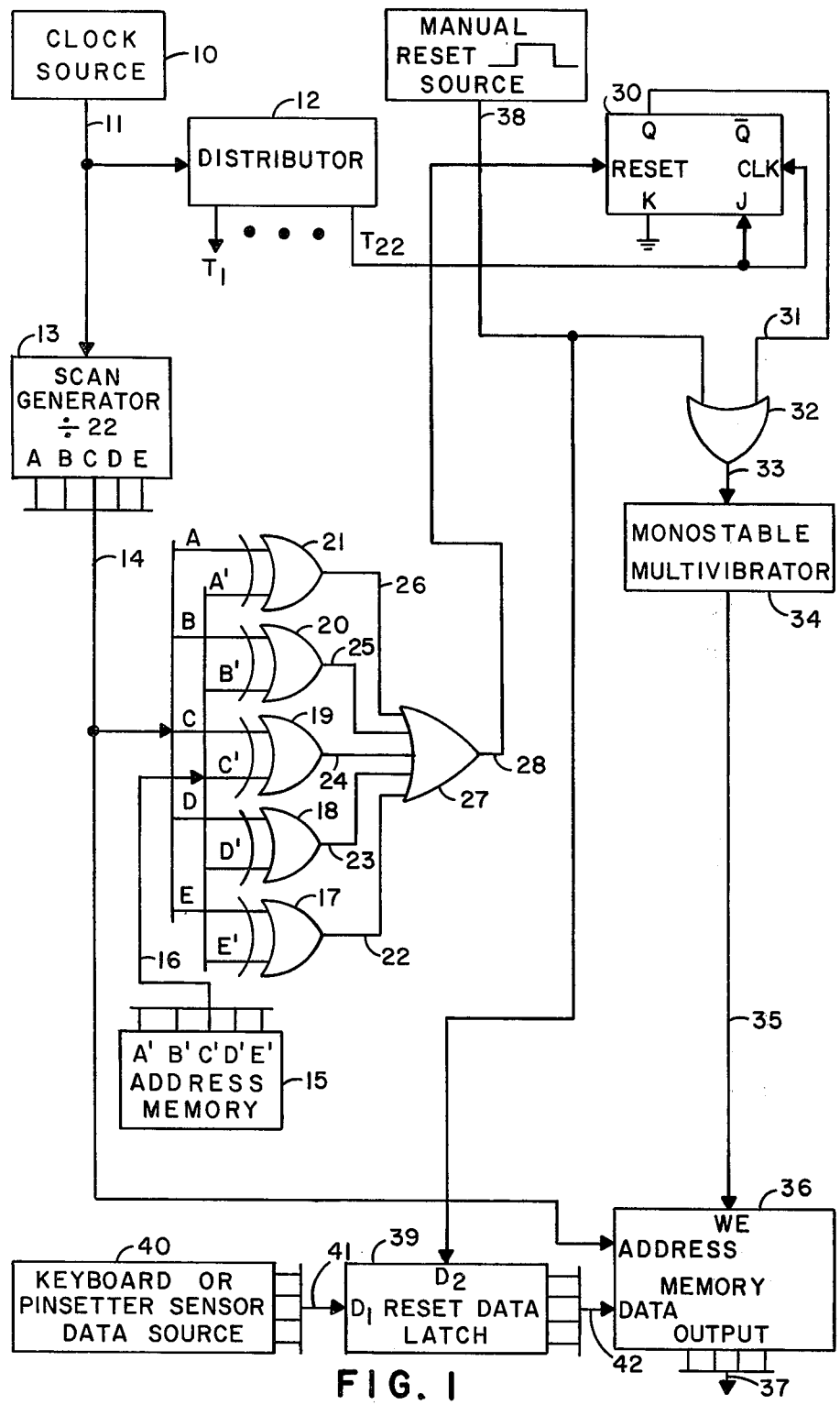

United States Patent [19]
Brunson

[11] 3,962,689
[45] June 8, 1976

[54] MEMORY CONTROL CIRCUITRY

[76] Inventor: Raymond D. Brunson, 5404 Brixham Court, Burke, Va. 22015

[22] Filed: Nov. 21, 1974

[21] Appl. No.: 525,917

[52] U.S. Cl. ............... 340/173 R; 340/173 FF; 340/173 RC; 307/221 C
[51] Int. Cl.² ........................................ G11C 13/00
[58] Field of Search.... 340/173 R, 173 FF, 173 RC; 307/221 C

[56] References Cited
UNITED STATES PATENTS
3,772,658  11/1973  Sarlo .............................. 340/173 R Primary Examiner—Terrell W. Fears
Attorney, Agent, or Firm—Warren H. Kintzinger

[57] ABSTRACT

A control circuit for reading from, and writing into, a random access memory into which successive data entries are stored at addresses in sequential binary order. A scan generator provides a repeated sequence of all sequential binary order addresses to the memory, and the write-enable input of the memory is controlled in synchronism with the memory addressing by continuously comparing the desired addresses of next-date entries with the scan generator addressing output, and enabling the write function of the memory when these addressing signals are the same.

8 Claims, 2 Drawing Figures

MEMORY CONTROL CIRCUITRY

This invention relates in general to digital data processing and, in particular, to a memory control circuit for a random access memory wherein data entries are stored in addresses in direct sequential order according to binary count and sequentially read out in the order of storage.

The control circuit to be described herein is particularly useful as a read and write control means for a random access memory, as employed in a scoring device used to compute bowling scores, by logically processing successive ball scores as would be stored in direct sequential order in the random access memory. The successive ball scores comprise data entries into the memory and are stored in direct binary sequence such that the address for each entry is a next higher binary number. For purposes of score computation from these ball score entries, it may be desired to repeatedly read out the data words in the order of storage, while each successive entry must be stored in a next higher sequential address.

Accordingly, the object of the present invention is the provision of a control circuitry which sequentially addresses a random access memory in direct binary sequence for sequential readout of data entries, and which causes a next data entry to be written in at an address which is always one greater than the next preceding address.

A further object of the present invention is the provision of a memory control for a random access memory which includes a zero reset capability whereby, on demand, the data entry in all addresses is caused to be binary zero.

Features of this invention useful in accomplishing the above objects include, in a control circuit for a random access memory, a binary count scan generator means which repeatedly generates, in direct binary sequence, all of the memory addresses. The output address sequence is applied as an addressing input to the random access memory. Synchronization of address input with the write-enable input to the memory is accomplished by comparing the assigned next sequentially higher address for each successive new data entry with the output of the address scan generator, such that each successive data entry is written in the memory at a next sequentially higher binary number address. Data readout is a continuous, repeated sequence of the total number of entries stored at any time, followed by zero readouts for those addresses higher than that at which the last data entry was written. A manual reset presents a binary zero data entry to the memory throughout a complete addressing sequence during which the write-enable input is modified to write the zero data into all addresses.

A specific embodiment representing what is presently regarded as the best mode of carrying out the invention is illustrated in the accompanying drawing.

In the drawing:

FIG. 1 represents a functional block diagram of the memory control circuit; and

Figure 2:
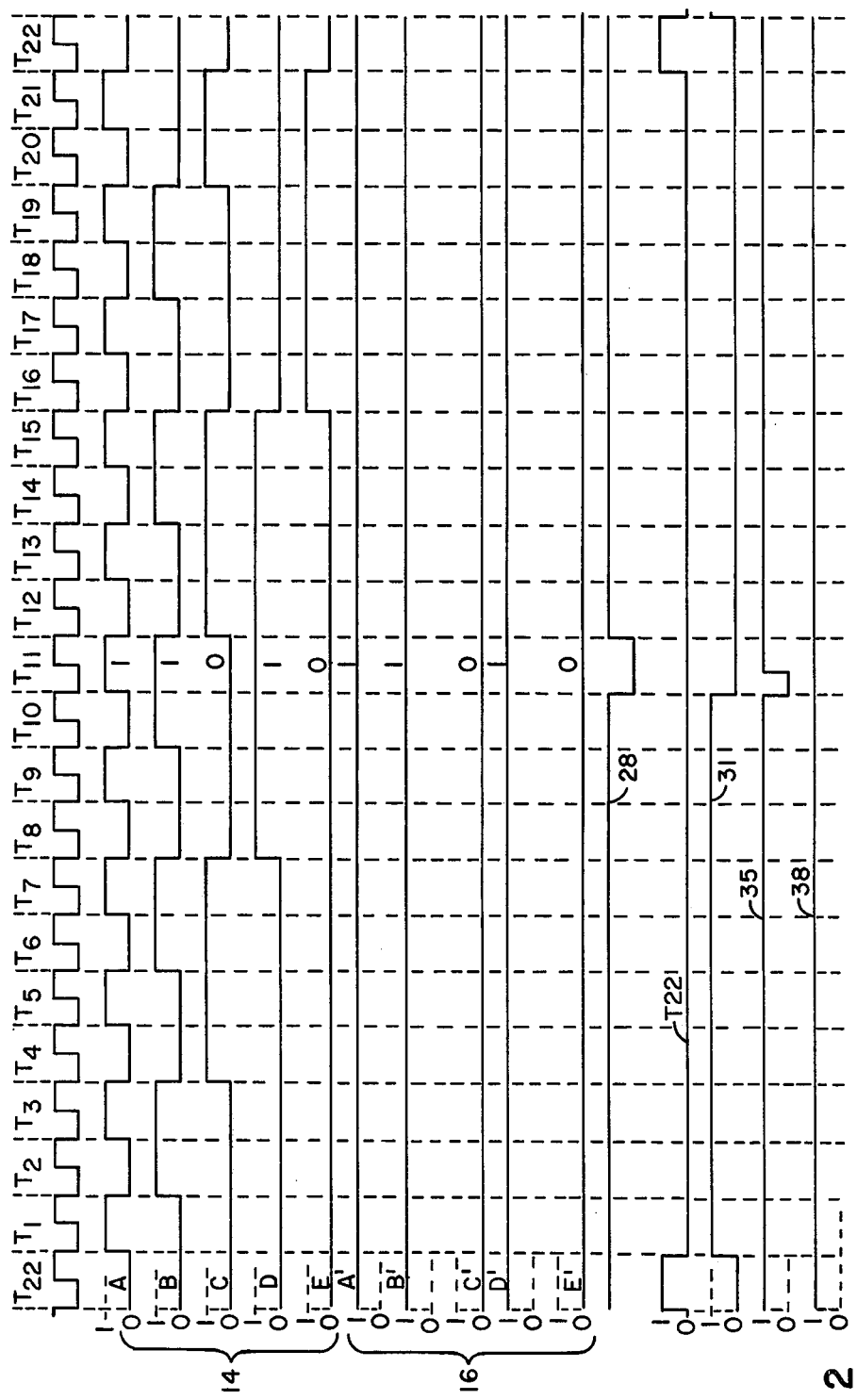

FIG. 2, operational waveforms related to the operation of the memory control circuit depicted in FIG. 1.

The control circuit of FIG. 1 is embodied as it might be useful in reading out successive bowling ball pin scores (pins knocked down) on a continuous basis in the order in which they were entered, and is useful in writing into the memory, at a next sequentially higher binary number address, new pin score entries as they occur. As such, the embodiment to be described, and as depicted in FIG. 1, is based on twenty-one possible data entries at sequential ones of twenty-one memory addresses, since twenty-one corresponds to the maximum number of balls that can be rolled in a line of bowling. Since no fewer than twelve balls can be rolled in a line, the control circuit may operate on the basis of from one to twenty-one successive data entries, corresponding to binary representations of the number of pins knocked down, on successively rolled balls. It is to be emphasized, however, that the invention is not limited to the specific embodiment to be herein described, and would be useful in the other environments where it is desired that entries into a memory be continuously read out in the sequence in which they were entered, and each new entry is written at a next sequentially higher address.

The circuit of FIG. 1 is controlled by a clock source 10 which provides clock pulses 11 to a distributor 12 to develop line-separated, sequential output pulses $T_1$ through $T_{22}$. Clock output 11 is also applied to a scan generator 13 which develops a continuous binary count output 14 from zero through twenty-one to provide sequential binary number addresses from 00000 through 10101 for the memory 36.

An address memory 15 provides a binary address from 00000 through 10101, corresponding to an address in memory 36, at which an instant data entry word is to be written. As above-discussed, the address memory would provide a next higher binary address, upon demand, as successive data is to be entered.

The binary address output 14 from scan generator 13 and the address at which new data is to be written are continuously compared, bit-by-bit, in five exclusive -OR gates 17 - 21. The most significant bit output, 14E, from scan generator 13, and the most significant bit output, 16E', of address memory 15, are applied to exclusive -OR gate 17, as are respective successively less significant bit outputs of generator 13 and address memory 15 in respective exclusive -OR gates 18, 19, 20, and 21.

Outputs 22 - 26 from exclusive -OR gates 17 - 21 are applied as respective imputs to an OR gate 27. Since exclusive -OR gates output a binary 0 when inputs thereto are of like logic (both 1 or both 0), the output of OR gate 27 will go from a logic 1 to logic 0 when the address memory output 16 and the scan generator output 14 are the same, thus providing a signal, the time occurrence of which signifies that a data entry should be written at the then existing memory address. As will be further described, the output pulse 28 from OR gate 27 is utilized in ensuing control circuitry to develop a write-enable input logic level to the memory 36, in response to synchronism between the scan generator addressing output and the address memory output, such that the data to be entered is written at the desired address.

The output 28 from OR gate 27 is applied as a reset input to a J-K flip-flop 30. A clock-defined signal $T_{22}$ (corresponding in time to the 00000 ouput from scan generator 13) is applied to both the clock and J inputs of flip-flop 30. The Q output 31 of flip-flop 30 is applied to an OR gate 32. A second input to OR gate 32 comprises a selectively imposed manual reset 38.

The output 33 from OR gate 32 is applied as a triggering input to a monostable multivibrator 34, with the output 35 of multivibrator 34 applied to the WE(write-enable) input of random access memory 36.

The data input 42 to memory 36 comprises the output of a zero reset data latch 39. Data latch 39 functions to transfer input data 41 on input $D_1$ to output 42 when control input $D_2$ is low (binary 0). With control input $D_2$, high (manual reset imposed), the output 42 of the latch is reset to zero for all conditions. The input data to latch 39 on $D_1$ comprises the ball score data word from an entry source 40 which might comprise a manually-operated keyboard, or, alternatively, a data word generated by sensor means associated with an automatic pin-setter equipment.

The truth table of the memory 36 is as follows:

| WE Input | Operation | Output |
|---|---|---|
| LOW | Write | Data Input |
| HIGH | Read | Addressed Word |

In operation, let it be assumed that a data word 41 from source 40 is to be written at a then presented address output 16 from address memory 15, and this address is eleven (01011). Reference is made to the operational waveforms of FIG. 2. Clock pulses 11 are applied to scan generator 13 to produce a continuous binary count from one (Time $T_1$) through twenty-one (Time $T_{21}$) and zero reset (Time $T_{22}$). Output 14 from scan generator is shown in FIG. 2 as the individual bit outputs 14A - 14E.

The address into which data is to be entered is shown as bit outputs 16A' - 16E' that are maintained in levels defining binary eleven (01011). Data entries are assumed to have been previously entered in memory addresses one through ten. As scan generator 13 sequences through counts in time frames $T_1 - T_{10}$, the data entries in these sequential binary addresses would be read out on memory output line 37. When the scan generator binary output goes to count eleven, the exclusive-OR circuitries 17 - 21 and OR gate 27 produce a binary zero output 28 which appears at the reset input of J-K flip-flop 30. Flip-flop 30 receives clock-defined output $T_{22}$ as a common input to the J and clock inputs thereof. Thus, the Q output 31 of flip-flop 30 goes low at the leading edge of reset input pulse 28. The negative going Q output is passed through OR gate 32 and triggers monostable multivibrator 34 to produce an output pulse of time duration defined by fixed components internal to the multivibrator. The negatively going output (Q) of multivibrator 34 comprises the write-enable input 35 to memory 36, and the data input 42 to memory 36 at this time is written into the memory at address 11. Prior to this negative going write-enable pulse, the multivibrator output remained at a high level such that data entries in all addresses presented to the memory were continuously being read out in sequence.

Thus, by way of operational summary, the output of the scan generator is applied to the memory for sequential addressing and is applied as well for comparison with the memory address output which defines where a next entry is to be written. This synchronized the signals of the memory address input and the write-enable of the memory. When the write-enable of the memory is high, the stored word selected by the instant address is read out of the memory. When the write-enable signal is low, the information present on the memory data input is stored at the location determined by the instant address.

The manual reset feature of the memory control circuit (heretofore assumed as being not imposed) causes zeros to be stored in all addresses of the memory 36, by placing zeros at the data input 42 of the memory while the write-enable input 35 is low for all addresses. As embodied in FIG. 1, the manual zero reset is imposed by application of a high logic level reset pulse which is maintained throughout a complete addressing cycle. This positive (high) pulse causes zero reset data latch to reset to zero output and maintain a zero output as long as the manual reset pulse 38 is imposed. The data input 42 to the memory is then 00000 throughout a full cycle of sequential addressing by output 14 of scan generator 13. The manual reset enables memory 36 by applying the manual reset pulse to OR gate 32, after which the write-enable signal 35 follows the same circuit path as a data write-enable signal.

Whereas this invention is herein illustrated and described with respect to a particular embodiment thereof, it should be realized that various changes may be made without departing from essential contributions to the art made by the teachings hereof.

I claim:

1. A system for controlling read and write functions of a random access memory to continuously read out therefrom in sequential binary order, data words stored in said memory and to selectively enter a next data word into a predetermined one of said memory addresses, comprising means for generating a binary scan sequence signal comprising a repeated clock signal controlled binary count corresponding to successive ones of a plurality of addresses in said random access memory; means for addressing said random access memory with said binary scan sequence signal; means for applying a next data word to be entered into said memory to the data input of said memory; means for comparing the binary address into which said next data word is to be entered with said binary scan signal during a time interval comprising at least that period of time required for said binary scan signal to generate signals corresponding to all of the addresses of said memory; said means for comparing a synchronization signal upon said binary scan and next data word address being the same; and means for applying said synchronization signal to write-enable pulse forming a logic means, in response to which said write-enable pulse forming logic means outputs a write-enable pulse; and said write-enable pulse being applied to said memory to cause said next data word to be written into the then addressed location in said memory.

2. The system of claim 1, wrein the predetermined address of next successive ones of said next data words to be entered are successively one greater than the address of the next preceding one of said words.

3. The system of claim 1, wherein said write-enable pulse forming logic pulse effects entry of said next data word at a time subsequent to the time occurrence of said synchronizing signal with a delay time not exceeding the time duration of the then existing address input to said memory.

4. The system of claim 3, wherein said binary scan signal comprises the collective bit outputs of a binary divider to which a clock input signal is provided, said binary divider effecting a division of said clock input by a factor of N, where N is the number of binary addresses in said memory.

5. The system of claim 3, wherein said means for generating said synchronization signal comprises a plurality of exclusive -OR logic gates, means applying respective like-significant bits of the binary output from said scan generator and those of the binary address of the next word to be entered as respective inputs to individual ones of said exclusive space -OR logic gates, an OR gating means receiving the outputs of said exclusive -OR gates as plural inputs thereto, and the output of said OR gating means comprising said synchronization signal.

6. The system of claim 4, wherein said write-enable pulse forming logic means comprises a J-K flip-flop receiving said synchronization signal as a reset input thereto, a monostable multivibrator having a pulse output time duration less than the time duration of the sequential binary address inputs to said memory, means triggering said multivibrator in response to a predetermined logic level change in the output of said flip-flop, and a clock signal defined triggering input signal applied to said flip-flop, said triggering input signal corresponding in time to that of a binary zero output from said binary divider.

7. The system of claim 3, further comprising means for selectively developing a zero reset logic pulse, means responsive to said zero reset pulse to provide a binary zero word as input data to said memory for the time duration of said zero reset logic pulse, said write enable pulse forming logic means receiving said zero reset logic pulse and developing in response thereto a write enable pulse during the respective time intervals of each successive one of the addresses inputted to said memory.

8. The system of claim 7, wherein said write-enable pulse forming logic means comprises logic circuits responsive to said zero reset logic input signal and said clock input signal to output a write-enable pulse during each successive cycle of said clock signal.

* * * * *